United States Patent [19]

Yamada

[11] Patent Number: 5,488,578
[45] Date of Patent: Jan. 30, 1996

[54] SEMICONDUCTOR MEMORY DEVICE INCLUDING BIT CHECK FUNCTION AND TESTING METHOD USING THE SAME

[75] Inventor: Akira Yamada, Hyogo, Japan

[73] Assignee: Mitsubishi Denki Kabushiki Kaisha, Tokyo, Japan

[21] Appl. No.: 296,395

[22] Filed: Aug. 26, 1994

[30] Foreign Application Priority Data

Sep. 3, 1993 [JP] Japan ..................... 5-219879

[51] Int. Cl.$^6$ .................................. G11C 15/00
[52] U.S. Cl. .................. 365/49; 365/189.07; 365/201; 365/200; 365/154; 365/189.09
[58] Field of Search ..................... 365/49, 189.07, 365/154, 156, 189.09, 190, 200, 201, 189.08, 210; 371/21.1, 11.1

[56] References Cited

U.S. PATENT DOCUMENTS 5,184,327  2/1993  Matsuda et al. .................. 365/201
5,195,099  3/1993  Ueda et al. ..................... 365/200 X
5,267,190  11/1993 Easley et al. .................... 365/49

Primary Examiner—David C. Nelms
Assistant Examiner—Huan Hoang
Attorney, Agent, or Firm—Lowe, Price, LeBlanc & Becker

[57] ABSTRACT

The semiconductor memory device includes word lines, bit line pairs crossing the word lines, memory cells disposed, a row decoder, and sense amplifiers. The device further includes a plurality of comparing circuits, a plurality of control circuits, and a determination signal generating circuit. Each comparing circuit compares a data signal read out from the corresponding memory cell with a reference signal externally applied when the reference signal is at an H level, and generates a result signal indicating whether or not the data signal matches the reference signal. Each control circuit carries out control so that a result signal from the comparing circuit indicates a match irrespectively of whether or not the data signal matching the reference signal when the reference signal is at an L level. The determination signal generating circuit generates a determination signal indicating a match when all of the results signals from the comparing circuits indicate a match, and generates a determination signal indicating a mismatch when any of the result signals from the comparing circuits indicates a mismatch.

10 Claims, 7 Drawing Sheets

SEMICONDUCTOR MEMORY DEVICE INCLUDING BIT CHECK FUNCTION AND TESTING METHOD USING THE SAME

BACKGROUND OF THE INVENTION

1. Field of the Invention

The present invention generally relates to a semiconductor device including a bit check function and a testing method using the same, and more particularly, to an improvement of a semiconductor memory device which can test a memory cell using the bit check function and a testing method using the same.

2. Description of the Background Art

In a semiconductor memory device including a bit check function (comparison function), plural-bit data stored in a memory cell and plural-bit data externally applied are verified to determine whether or not these data match each other. Upon this determination, it is determined whether or not the plural-bit data stored in the memory cell is desired data. As a result, it is determined whether the memory cell is defective or not.

A tag memory in a cash memory is taken as an example of a semiconductor memory device including a comparison function. In the tag memory, tag data in an input address is prestored. The tag data and tag data stored in a cash memory are compared during data retrieval, whereby it is determined whether these data match or not. The tag memory is used for determination of a cash hit, hit miss or the like of data in the cash memory.

FIG. 8 is a block diagram showing a configuration of a semiconductor memory device including a comparison function disclosed in Japanese Patent Laying-Open No. 4-368695. Referring to FIG. 8, the semiconductor memory device includes a plurality of word lines WL disposed in the rows, a row decoder 1 selecting one of the word lines WL, a plurality of bit line pairs BL, $\overline{BL}$ disposed in the columns crossing the word lines WL, a plurality of memory cells 4 disposed at crossing points of the word lines WL and the bit line pairs BL, $\overline{BL}$, and a plurality of sense amplifiers 5 provided corresponding to the bit line pairs BL, $\overline{BL}$.

Both bit lines BL and $\overline{BL}$ of each bit line pair BL, $\overline{BL}$ are respectively connected to power supply nodes 3 supplied with the power supply potential Vcc through load transistors 2. Each memory cell 4 stores one-bit data.

Therefore, when row decoder 1 selects one word line WL, data is read out from memory cells 4 connected to the word line WL to the bit line pairs BL, $\overline{BL}$. Data signals corresponding to the data are respectively applied to sense amplifiers 5 through the bit line pairs BL, $\overline{BL}$. In response to a corresponding data signal, each sense amplifier 5 determines whether data in the corresponding memory cell 4 is "1" or "0".

The semiconductor memory device further includes a plurality of exclusive OR gates 6 provided corresponding to sense amplifiers 5, a plurality of discharge N channel MOS transistors 7 provided corresponding to gates 6, a match line 8 connecting the drain electrodes of transistors 7 in common, and a load P channel MOS transistor 9 connected between match line 8 and a power supply node 10 supplied with the power supply potential Vcc.

The semiconductor memory device is externally supplied with n-bit reference signals RF1 to RFn. The reference signal RF1 and a data signal D from corresponding sense amplifier 5 are applied to corresponding exclusive OR gate 6. Exclusive OR gate 6 generates a result signal X in response to signals RF1 and D. Each discharge transistor 7 conducts match line 8 to a ground node in response to the result signal X from corresponding exclusive OR gate 6.

Since the gate electrode of load transistor 9 is supplied with the ground potential, transistor 9 is maintained conductive. Therefore, match line 8 is supplied with the power supply potential Vcc through transistor 9, whereby match line 8 is slightly set to an H (logic high) level. The potential of match line 8 is provided outside as a determination signal Y.

In FIG. 8, one bit line pair BL, $\overline{BL}$, memory cells 4 connected to the one bit line pair BL, $\overline{BL}$, load transistors 2 connected to the one bit line pair BL, $\overline{BL}$, a sense amplifier 5 connected to the bit line pair BL, $\overline{BL}$, and an exclusive OR gate 6 corresponding to sense amplifier 5 configure one block B1. In the semiconductor memory device, n such blocks B1 to Bn are disposed in the row direction.

It should be noted that a writing circuit to a memory cell and a column decoder for selecting a bit line pair which are not directly relevant to the present invention are not shown in FIG. 8.

Comparison operation of the semiconductor memory device of the above configuration will be described.

One word line WL is selected by row decoder 1. Data is respectively read out from n memory cells 4 connected to the selected word line WL to n bit line pairs BL, $\overline{BL}$. Data signals corresponding to data read out from memory cells 4 appear on one bit line BL, and data signals complementary to the data signals appear on the other bit line $\overline{BL}$.

These data signals are applied to sense amplifier 5. Sense amplifier 5 amplifies the data signals to provide one data signal D to exclusive OR gate 6. Exclusive OR gate 6 receives the data signal D provided from sense amplifier 5 and a predetermined reference signal RF1 applied externally, to generate a result signal X at an L (logic low) level if these signals match each other, and to generate a result signal X at an H level if these signals do not match each other.

Therefore, in all of the block B1 to Bn, when data signals D provided from sense amplifier 5 and externally applied reference signals RF1 to RFn respectively match each other, all the result signals X provided from the blocks B1 to Bn attain an L level. All the discharge transistors 7 are rendered non-conductive, and match line 8 is maintained at an H level. Therefore, a determination signal Y at an H level is provided, whereby it is determined that data signals D read out from memory cells 4 and externally applied reference signals RF1 to RFn all match each other.

On the other hand, when data signals D provided from sense amplifiers 5 and externally applied reference signals RF1 to RFn do not match each other even in any one block, the result signal X at an H level is provided from the block. Discharge transistor 7 which receives the result signal at an H level at its gate electrode is rendered conductive, and charge of match line 8 precharged to an H level is removed through discharge transistor 7. Therefore, the determination signal Y at an L level is provided from match line 8, whereby it is determined that at least one of n-bit data signals read out from the memory cells does not match its corresponding reference signal.

A method of testing the memory cell using the semiconductor memory device shown in FIG. 8 will be described with reference to FIG. 9. FIG. 9 is a flow chart showing a testing method for identifying a defective memory cell in four memory cells 4.

In a defective memory cell, data at an L level is read out although data at an H level is written, or data at an H level is read out although data at an L level is written. Irrespectively of a level of written data, data at an H level is always read out, or data at an L level is always read out.

According to this testing method, after four-bit data is written in four memory cells 4 to be tested, data is read out from memory cells 4. Then, the read out four-bit data and externally applied four-bit reference data are compared as described above, and it is determined whether the data match each other.

Such a comparison as described above is carried out in various combinations of written data and reference data, resulting in identification of a location of a defective memory cell.

More specifically, at step S20, data of "HHHH" is written in four memory cells 4. At step S21, data is read out from four memory cells 4.

At step S22, the read data is compared with a reference signal of "HHHH". At step S23, the read data is compared with a reference signal of "LHHH". At step S24, the read data is compared with a reference signal of "HLHH". At step S25, the read data is compared with a reference signal of "HHLH". At step S26, the read data is compared with a reference signal of "HHHL".

At step S27, after data of "LLLL" is written in four memory cells 4, data is read out from memory cells 4 at step S28. At step S29, the read data is compared with a reference signal of "LLLL". At step S30, the read data is compared with a reference signal of "HLLL". At step S30, the read data is compared with a reference signal of "LHLL". At step S32, the read data is compared with a reference signal of "LLHL". At step S33, the read data is compared with a reference signal of "LLLH".

As described above, as a result of ten comparisons of data read out from the memory cells and externally applied reference data, a defective memory cell 4 is located. When data at an L level is read out although data at an H level is written in a memory cell of the 0-th bit, for example, out of four memory cells 4 because the memory cell is defective, it is determined that a memory cell at the 0-th bit is defective since the signals match each other as a result of comparison at step S23.

On the other hand, when the signals match each other as a result of comparison at step S22, and the signals match each other as a result of comparison at step S29, it is determined that there is no defective memory cell.

According to the above testing method, when there is only one defective memory cell, the defective memory cell can be located. However, when there are a plurality of defective memory cells, it is very difficult to locate the defective memory cells.

When a data signal at an H level is always read out from a memory cell of the first bit and a data signal at an L level is always read out from a memory cell of the third bit, for example, it is necessary to write data of "HHHH" to memory cells and to sequentially compare data signals read out from the memory cells with $2^4$ combinations of reference signals, and further to write data of "LLLL" to the memory cells and to sequentially compare data signals read out from the memory cells again with $2^4$ combinations of reference signals. Therefore, $(2^4 \times 2)$ comparisons must be carried out during one test. Since the number of times of comparisons increases exponentially as increase of the number of memory cells to be tested, it is extremely difficult to locate defective memory cells in a plurality of memory cells.

As described above, in the conventional semiconductor memory device, it is possible to determine whether a defective memory cell exists or not in a plurality of memory cells 4 connected to one word line WL selected by row decoder 1. However, it is extremely difficult to locate a defective memory cell. Since an intricate test must be carried out for locating a defective memory cell, a time required for the test becomes long.

SUMMARY OF THE INVENTION

One object of the present invention is to provide a semiconductor memory device which can determine whether a memory cell is defective or non-defective, and a testing method using the same.

Another object of the present invention is to provide a semiconductor memory device which can locate a defective memory cell, and a testing method using the same.

Still another object of the present invention is to facilitate identification of a defective memory cell.

A further object of the present invention is to shorten a time required for identification of a defective memory cell.

A further object of the present invention is to achieve the above-described objects with a simple circuit.

The semiconductor memory device according to one aspect of the present invention includes a plurality of memory cells, a reading/writing circuit, a plurality of comparing circuits, and a determination signal generating circuit. The plurality of memory cells are connected to one word line selected by a row decoder, for example. Each of the plurality of memory cells stores one-bit data. The reading/writing circuit reads out data from the plurality of memory cells, and writes data to the plurality of memory cells. The plurality of comparing circuits are provided corresponding to the plurality of memory cells, and compare a plurality of data signals corresponding to data read out from the plurality of memory cells by the reading/writing circuit with a plurality of reference signals externally applied corresponding to the plurality of data signals, correspondingly. Each of the plurality of comparing circuits generates a result signal indicating whether or not each data signal matches the corresponding reference signal when the corresponding reference signal is at a first logic level, and generates a result signal indicating a match irrespectively of whether or not each data signal matching the corresponding reference signal when the corresponding reference signal is at a second logic level. The determination signal generating circuit generates a determination signal indicating a match when all of the result signals from the plurality of comparing circuits indicate a match, and generates a determination signal indicating a mismatch when any of the result signals from the plurality of comparing circuits indicates a mismatch.

The semiconductor memory device according to another aspect of the present invention includes a plurality of memory cells, a reading/writing circuit, a plurality of comparing circuits, a plurality of control circuits, and a determination signal generating circuit. The plurality of memory cells are connected to one word line selected by a row decoder, for example. Each of the plurality of memory cells stores one-bit data. The reading/writing circuit reads out data from the plurality of memory cells, and writes data to the plurality of memory cells. The plurality of comparing circuits are provided corresponding to the plurality of memory cells. Each of the plurality of comparing circuits compares a data signal corresponding to data read out from the corresponding memory cell by the reading/writing circuit with a reference signal externally applied corresponding to the data signal when the corresponding reference signal is at a first logic level, and generates a result signal indicating whether or not the data signal matches the reference signal. The plurality of control circuits are provided corresponding to the plurality of comparing circuits. Each of the plurality of control circuits carries out control so that a result signal from the corresponding comparing circuit indicates a match irrespectively of whether or not the corresponding data signal matching the corresponding reference signal when the corresponding reference signal is at a second logic level. The determination signal generating circuit generates a determination signal indicating a match when all of the result signals from the plurality of comparing circuits indicate a match, and generates a determination signal indicating a mismatch when any of the result signals from the plurality of comparing circuits indicates a mismatch.

The plurality of control circuits are preferably activated in response to a predetermined activation signal.

Each of the plurality of control circuits preferably includes a logical product circuit. In response to a result signal from the corresponding comparing circuit and the corresponding reference signal, the logical product circuit supplies their logical product signal instead of the result signal.

Each of the plurality of comparing circuits preferably includes first and second amplifying circuits, and a supplying circuit. The first amplifying circuit is activated in response to the corresponding reference signal. When activated, the first amplifying circuit amplifies a first data signal corresponding to data read out from the corresponding memory cell. The second amplifying circuit is activated in response to a determination signal of the corresponding reference signal. When activated, the second amplifying circuit amplifies a second data signal complementary to the first data signal. In response to the outputs from first and second amplifying circuits, the supplying circuit supplies the result signal to the determination signal generating circuit.

The testing method using the semiconductor memory device according to a further aspect of the present invention includes the steps of writing data corresponding to a first logic level to a plurality of memory cells, reading out data from the plurality of memory cells, supplying a plurality of reference signals including one reference signal corresponding to one of the plurality of memory cells at the first logic level and the other reference signals at a second logic level to a plurality of comparing circuits correspondingly, and determining that the one memory cell is defective when a determination signal from a determination signal generating circuit indicates a mismatch.

Therefore, the main advantage of the present invention is to easily locate a defective memory cell, because it is possible to determine whether one of a plurality of memory cells is defective or not.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in detail with reference to the drawings.

EMBODIMENT 1

Figure 1:
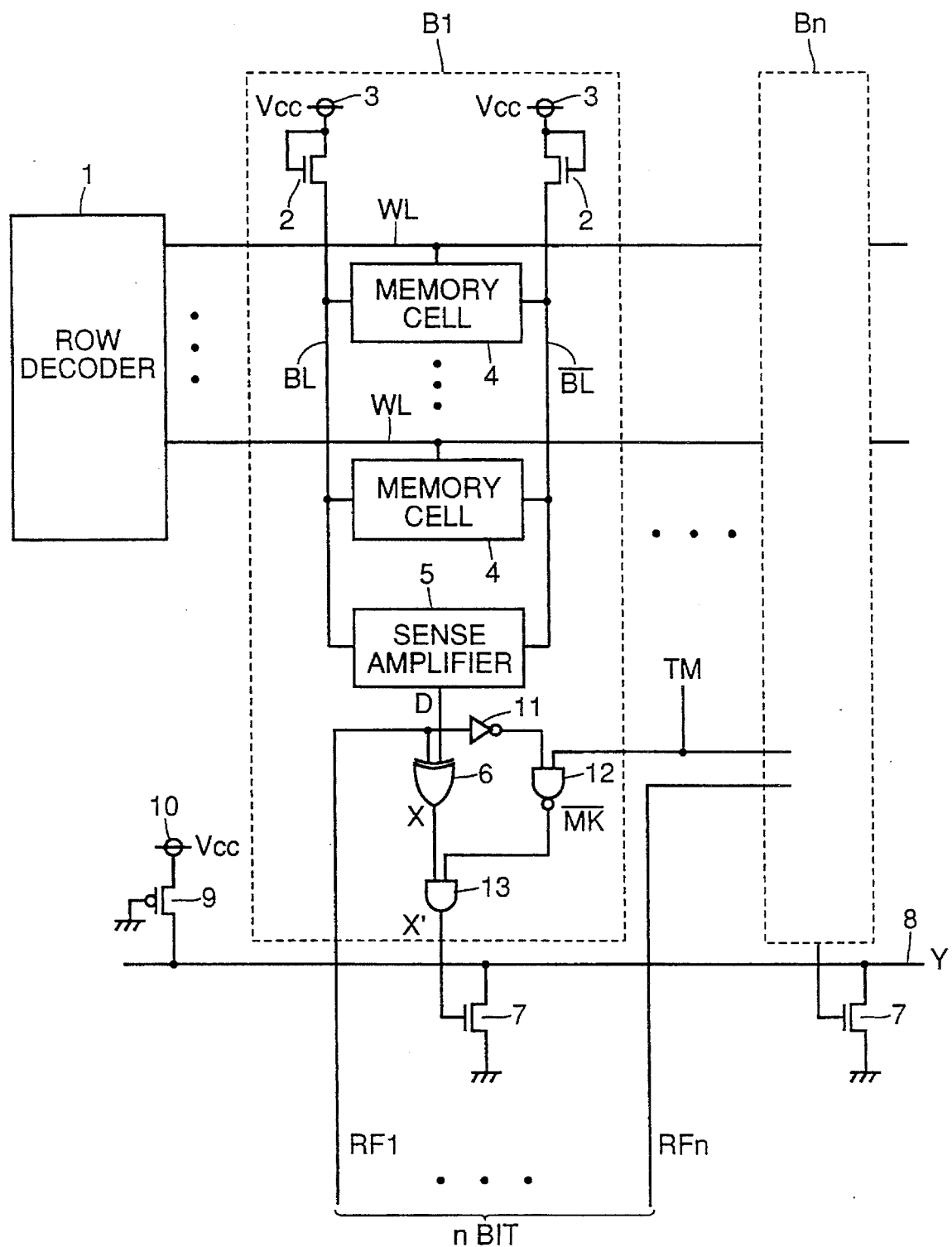
FIG. 1 is a block diagram showing a configuration of a semiconductor memory device according to Embodiment 1 of the present invention.

FIG. 1 is a block diagram showing a configuration of a static random access memory (SRAM) according to Embodiment 1 of the present invention. Referring to FIG. 1, the SRAM includes a plurality of word lines WL disposed in the rows, a row decoder 1 for selecting one of the plurality of word lines WL, n bit line pairs BL, $\overline{BL}$ disposed in the columns crossing the word lines WL, a plurality of memory cells 4 disposed at crossing points of the word lines WL and the bit line pairs BL, $\overline{BL}$, and n sense amplifiers 5 each connected to a corresponding one of the bit line pairs, $\overline{BL}$.

Bit lines BL, $\overline{BL}$ of each bit line pair BL, $\overline{BL}$ are respectively connected to power supply node 3 supplied with the power supply potential Vcc through two load transistors 2. Load transistor 2 is configured of a diode-connected N channel MOS transistor.

n memory cells 4 are connected to one word line WL. Each memory cell 4 stores one-bit data. Each sense amplifier 5 amplifies a complementary data signal read out to corresponding bit line pair BL, $\overline{BL}$, thereby determining whether data in the corresponding one memory cell 4 is "1" or "0".

The SRAM further includes n exclusive OR gates 6, n discharge transistors 7, n inverters 11, n NAND gates 12, n AND gates 13, and one load transistor 9. Each exclusive OR gate 6 generates a result signal X in response to a data signal D supplied from a corresponding one sense amplifier 5 and one of n-bit reference signals RF1 to RFn applied externally. Each inverter 11 receives a corresponding one reference signal and supplies an inverted signal thereof to a corresponding one NAND gate 12. n NAND gates 12 are also supplied with one test mode signal TM. The test mode signal TM is a signal for selecting one of two predetermined comparison operations. Each NAND gate 12 generates a mask signal $\overline{MK}$ in response to an inverted signal from a corresponding one inverter 11 and the test mode signal TM. Each AND gate 13 generates a result signal X' in response to the result signal X from a corresponding one exclusive OR gate 6 and the mask signal $\overline{MK}$ from a corresponding one NAND gate 12.

Each discharge transistor 7 is configured of an N channel MOS transistor, and connected between match line 8 and the ground node. More specifically, all the drain electrodes of n discharge transistors 7 are connected to one match line 8 in common. The gate electrode of each discharge transistor 7 is supplied with the result signal X' from the corresponding one AND gate 13. Load transistor 9 is configured of a P channel MOS transistor and connected between a power supply node 10 supplied with the power supply potential Vcc and match line 8. The gate electrode of load transistor 9 is supplied with the ground potential.

In FIG. 1, one bit line pair BL, $\overline{BL}$, two load transistors 2 respectively connected to the one bit line pair BL, $\overline{BL}$, a plurality of memory cells 4 connected to the one bit line pair BL, $\overline{BL}$, sense amplifier 5 connected to the one bit line pair BL, $\overline{BL}$, exclusive OR gate 6 connected to sense amplifier 5, inverter 11 corresponding to exclusive OR gate 6, NAND gate 12, and AND gate 13 configure one block B1. Therefore, the SRAM includes n blocks B1 to Bn disposed in the row direction. The SRAM according to Embodiment 1 is different from that shown in FIG. 8 in that inverter 11, NAND gate 12 and AND gate 13 are provided in each block.

Figure 2:
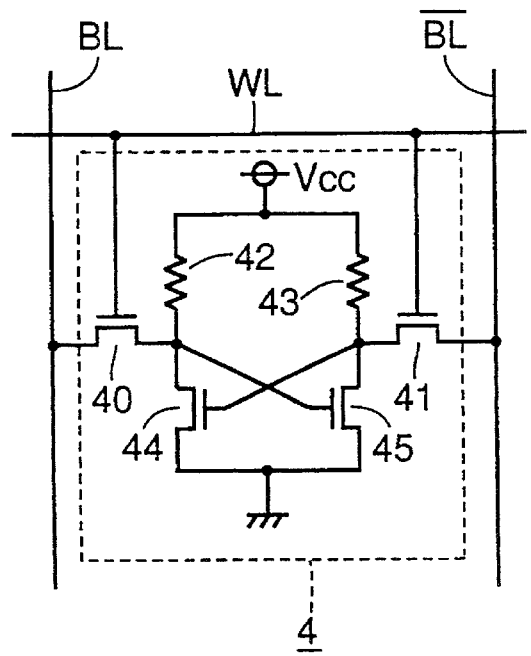
FIG. 2 is a circuit diagram showing a configuration of a high resistance load type memory cell.

FIG. 2 shows one example of each memory cell 4 in the SRAM shown in FIG. 1. Referring to FIG. 2, memory cell 4 includes transfer gates 40 and 41 controlled in response to the word line WL, resistances 42 and 43, and N channel MOS transistors 44 and 45. Such memory cell 4 is generally called a high resistance load type memory cell.

Figure 3:
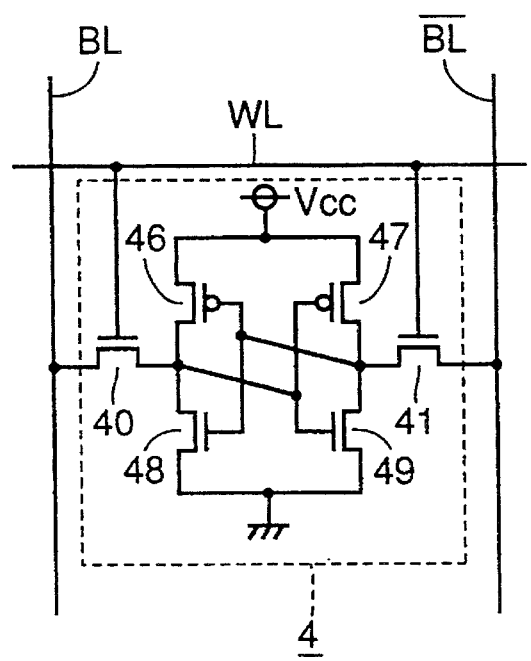
FIG. 3 is a circuit diagram showing a configuration of a full CMOS type memory cell.

FIG. 3 shows another example of each memory cell 4 in the SRAM shown in FIG. 1. Referring to FIG. 3, memory cell 4 includes transfer gates 40 and 41 controlled in response to the word line WL, P channel MOS transistors 46 and 47, and N channel MOS transistors 48 and 49. Such memory cell 4 is generally called a CMOS type memory cell.

In memory cells 4 of FIGS. 2 and 3, when the potential of the word line WL attains an H level, transfer gates 40 and 41 are rendered conductive. As a result, complementary data signals on the bit line pair BL, $\overline{BL}$ are internally latched in the writing operation, and the internally latched data signals are read out to the bit line pair BL, $\overline{BL}$ in the reading operation.

Figure 4:
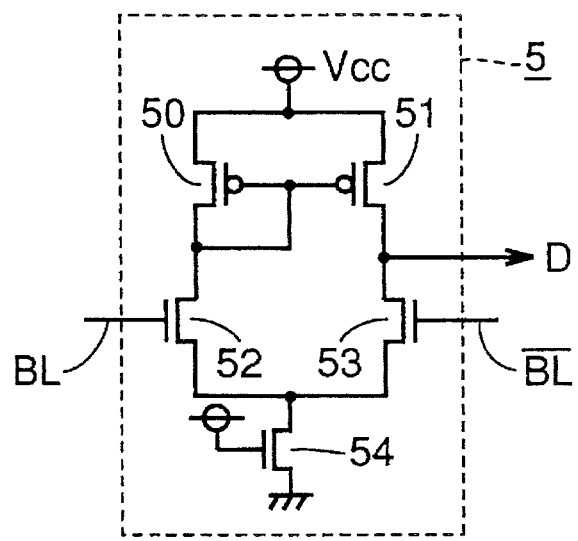
FIG. 4 is a block diagram showing a configuration of a current mirror type sense amplifier.

FIG. 4 shows one example of sense amplifier 5 in the SRAM shown in FIG. 1. Referring to FIG. 4, sense amplifier 5 includes P channel MOS transistors 50 and 51 configuring a current mirror circuit, N channel MOS transistors 52 and 53 each having a gate connected to one of the bit line pair BL, $\overline{BL}$, and an N channel MOS transistor 54 connected between the source electrodes of transistors 52, 53 and the ground node.

Figure 5:
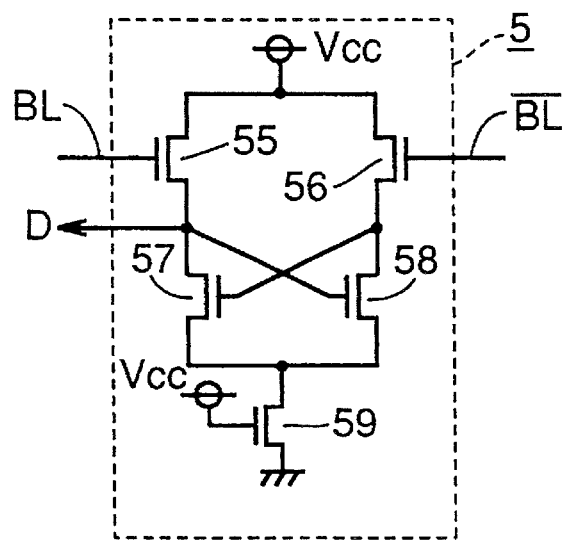
FIG. 5 is a circuit diagram showing a configuration of a cross-coupling type sense amplifier.

FIG. 5 shows another example of sense amplifier 5 in the SRAM shown in FIG. 1. Referring to FIG. 5, sense amplifier 5 includes N channel MOS transistors 55 and 56 each having a gate electrode connected to one of the bit line pair BL, $\overline{BL}$, cross-coupled N channel MOS transistors 57 and 58, and an N channel MOS transistor 59 connected between the source electrodes of transistors 57, 58 and the ground node.

Sense amplifiers shown in FIGS. 4 and 5 supply the data signal D at an H level when data read out from memory cell 4 is "1".

Operation of the SRAM configured as described above will now be described.

Figure 8:
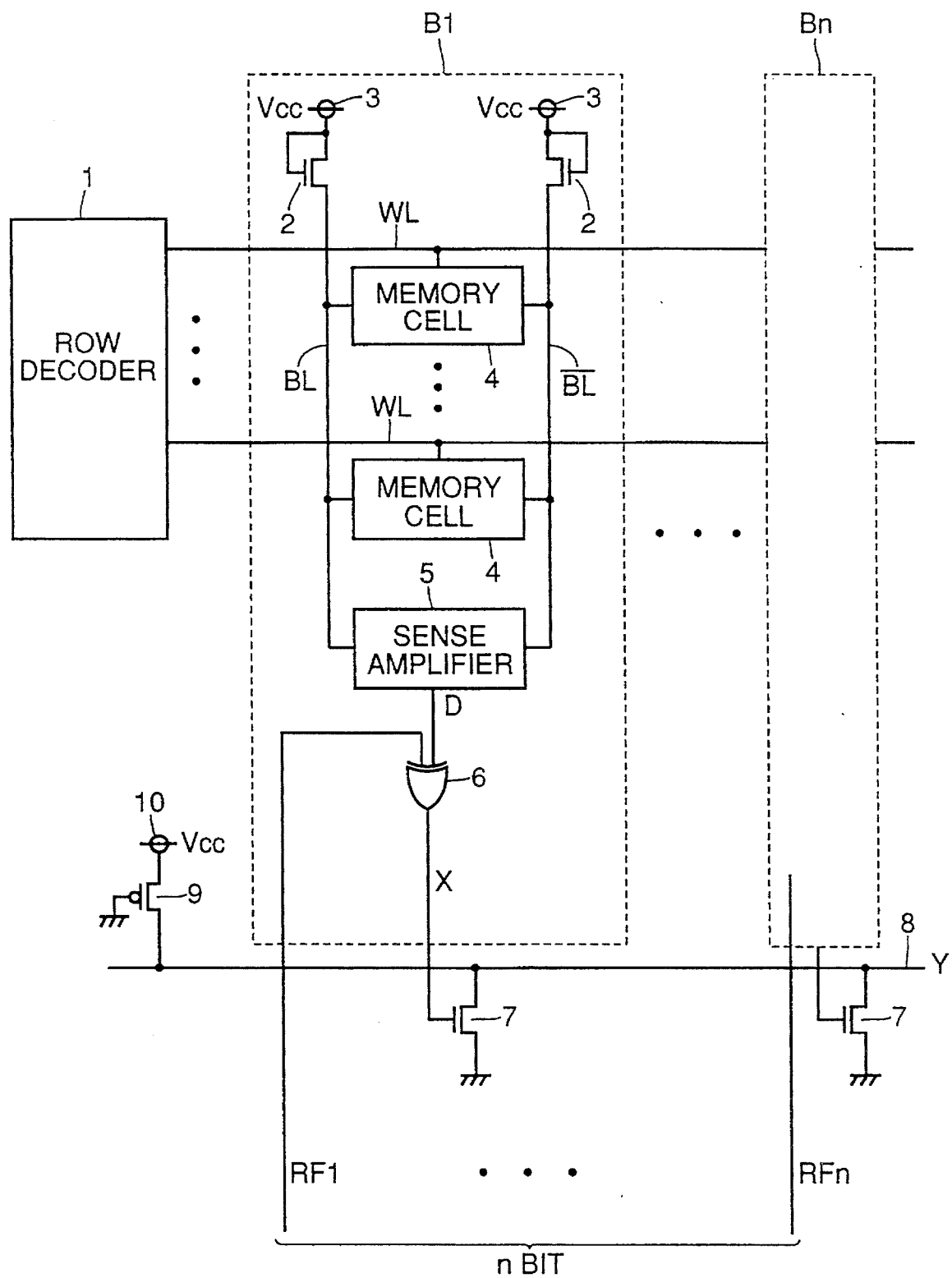
FIG. 8 is a block diagram showing a configuration of a conventional semiconductor memory device.
Figure 9:
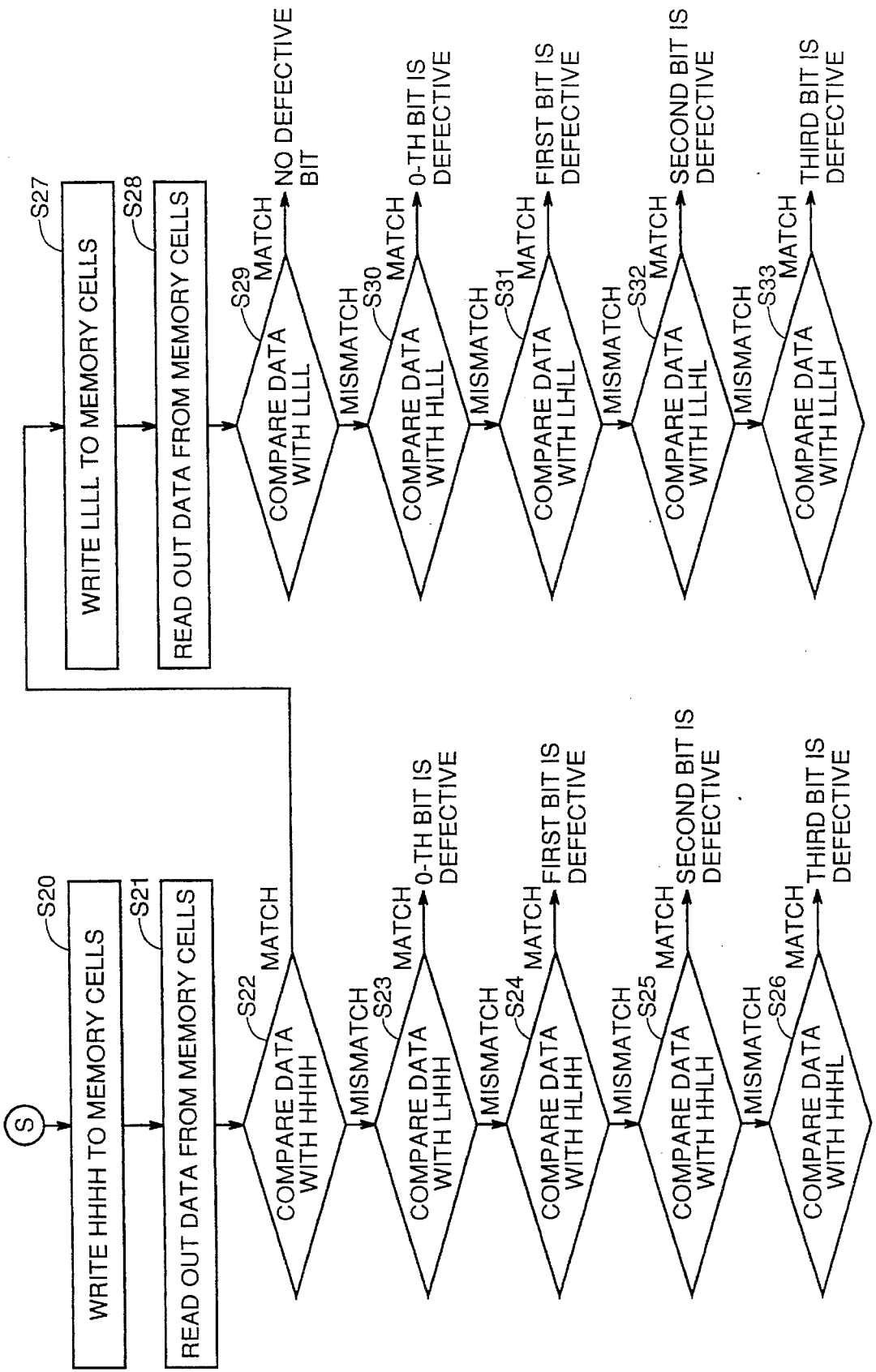
FIG. 9 is a flow chart showing a method of determining whether memory cells are defective or not using the conventional semiconductor memory device shown in FIG. 8.

When the test mode signal TM is set to an L level, normal comparison operation is carried out similar to the case of the conventional semiconductor memory device shown in FIG. 8.

Since the test mode signal TM at an L level is applied to NAND gate 12, NAND 12 always applies the mask signal $\overline{MK}$ at an H level to AND gate 13. Therefore, AND gate 13 applies the result signal X applied from exclusive OR gate 6 to discharge transistor 7 directly as the result signal X'.

Since an output signal X of exclusive OR gate 6 is applied to the gate electrode of discharge transistor 7 through AND gate 13 as described above, the normal comparison operation is carried out similar to the case of the conventional semiconductor memory device shown in FIG. 8.

On the other hand, when the test mode signal TM is set to an H level, the test mode signal TM at an H level is applied to AND gates 12 in n blocks of B1 to Bn. The operation of block B1 will be described hereinafter.

Since the test mode signal TM at an H level is applied to AND gate 12, the mask signal $\overline{MK}$ is determined by the reference signal RF1 applied through inverter 11.

When the reference signal RF1 is at an L level, NAND gate 12 applies the mask signal $\overline{MK}$ at an L level to AND gate 13. Therefore, irrespectively of whether the result signal X from exclusive OR gate 6 being at an H level or an L level, AND gate 13 always generates the result signal X' at an L level. As a result, the result signal X' at an L level is applied to the gate electrode of discharge transistor 7. Therefore, charge of match line 8 is not removed by discharge transistor 7.

In other words, when the test mode signal TM is at an H level and the reference signal RF1 is at an L level, the result signal X (X') from exclusive OR gate 6 is controlled so as to always indicate a match irrespectively of whether the data signal D supplied from sense amplifier 5 and the reference signal RF1 matching or not, resulting in masking of the comparison operation of block B1.

When the reference signal RF1 is at a H level, the inverted signal thereof (L level) is applied to NAND gate 12 from inverter 11, and NAND gate 12 applies the mask signal $\overline{MK}$ at an H level to AND gate 13. Therefore, AND gate 13 applies to the gate electrode of discharge transistor 7 the result signal X applied from exclusive OR gate 6 directly as the result signal X'. As a result, normal comparison operation is carried out in block B1.

When such an SRAM as described above is used to locate the defective memory cell, the test mode signal TM is set to an H level, and operation as roughly described below is carried out.

First, predetermined test data is written in memory cells 4. Then, one word line WL is selected by row decoder 1, and data is read out from n memory cells 4 connected to the selected word line WL. The data signals D corresponding to the read out data are provided from sense amplifiers 5.

The data signals D and the externally applied reference signals RF1 to RFn are respectively supplied to exclusive OR gates 6. When the signals match each other, the result signal X at an L level is provided from exclusive OR gate 6, and when the signals do not match each other, the result signal X at an H level is provided from exclusive OR gate 6.

As described above, in the block supplied with a reference signal at an L level, the comparison operation is masked. Therefore, if a reference signal at an H level is applied to only one block and reference signals at an L level are applied to the other blocks, the comparison operation is carried out only in the block supplied with a reference signal at an H level. Therefore, by sequentially changing blocks supplied with a reference signal at an H level, a defective memory cell can be located.

Figure 6:
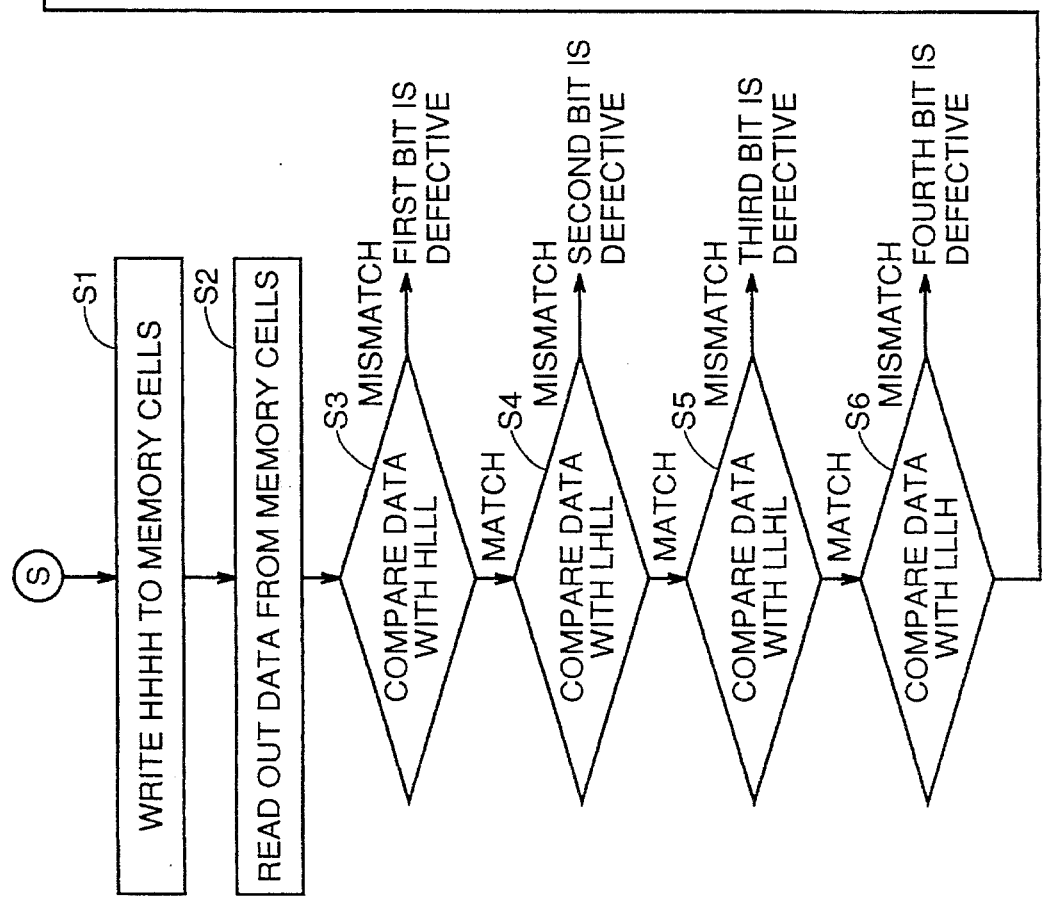
FIG. 6 is a flow chart showing a method of determining whether memory cells are defective or not using the semiconductor memory device shown in FIG. 1.
Figure 6:
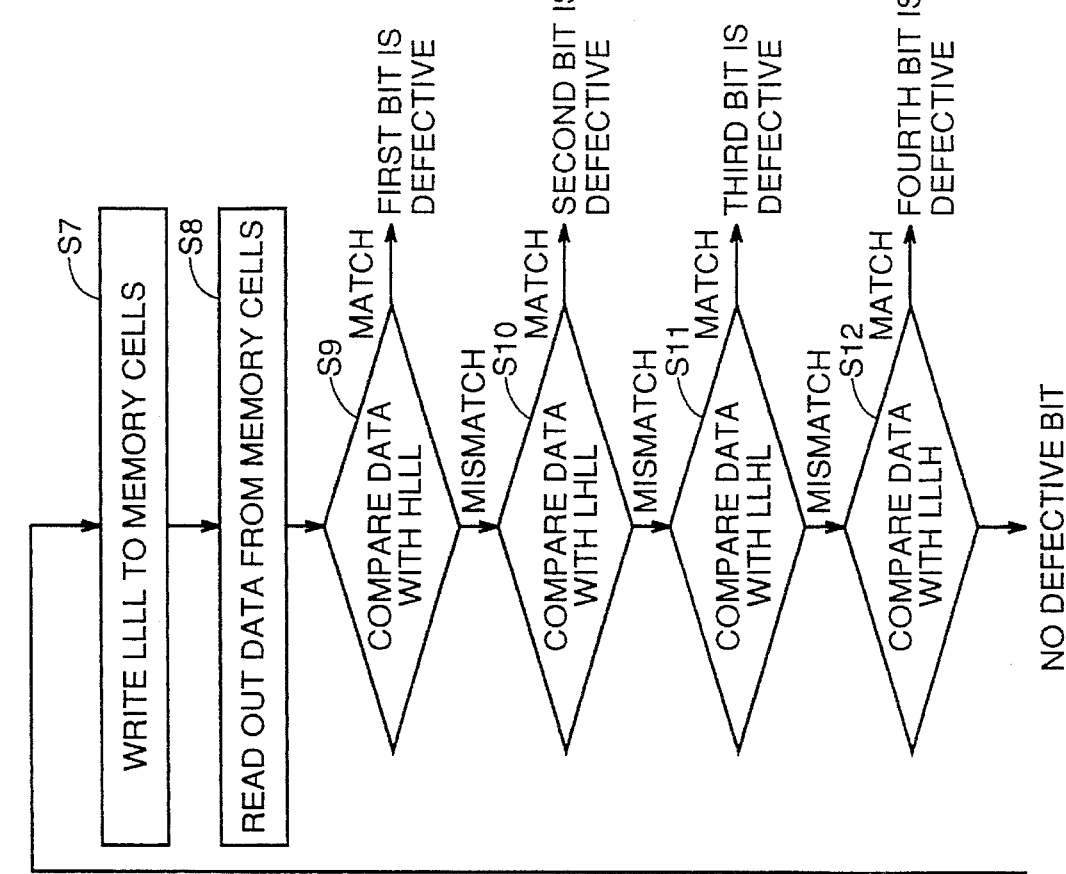

Such a method of identifying a defective memory cell will be described specifically with reference to FIG. 6.

At step S1, data of "HHHH" is written in four memory cells 4 disposed in the row direction. At step S2, data is read out from four memory cells 4.

At step S3, the read four-bit data signal D is compared with an externally applied reference signal of "HLLL". Since reference signals at an L level are respectively applied to the second to the fourth blocks, the comparison operation is not carried out in these blocks. However, since the reference signal RF1 at an H level is applied to the first clock B1, the comparison operation is carried out in the first block B1.

Since result signals at an L level are always provided from the second and the third blocks, charge of match line 8 is not discharged by these result signals. Therefore, when a data signal at L level is read out from memory cells 4 in the first block B1 although data at an H level is stored, the signal D at an L level does not match the corresponding reference signal RF1 at an H level. As a result, the result signal X' at an H level is provided from the first block B1, and in response to the result signal X' at an H level, corresponding discharge transistor 7 is rendered conductive. Match line 8 is discharged through transistor 7, resulting in output of the determination signal Y at an L level. As a result, it is determined that memory cell 4 of the first bit in the first block B1 is defective.

If the read data signal D matches the reference signal of "HLLL", the read data signal D is compared with a reference signal of "LHLL" at step S4. Since reference signals at an L level are applied to the first, the third, and the fourth blocks, the comparison operation is not carried out in these blocks. Since a reference signal at an H level is applied to the second block, the comparison operation is carried out in the second block. Therefore, if the read data signal D does not match the reference signal of "LHLL", it is determined that a memory cell of the second bit in the second block is defective.

If the read data signal D matches the reference signal of "LHLL", the read data signal D is compared with a reference signal of "LLHL" at step S5. Similar to the above, if the read data signal D does not match the reference signal of "LLHL", it is determined that a memory cell of the third bit in the third block is defective.

If the read data signal D matches the reference signal of "LLHL", the read data signal D is compared with a reference signal of "LLLH" at steps S6. Similar to the above, if the read data signal D does not match the reference signal of "LLLH", it is determined that a memory cell of the fourth bit in the fourth block is defective.

According to the above-described procedure, when a data signal at an L level is read out although a data signal at an H level is written to a memory cell, the defective memory cell can be located. However, when data at an H level is always read out irrespectively of a level of data written to a memory cell, such a defective memory cell cannot be located.

If the read data signal D matches the reference signal of "LLLH" at step S6, data of "LLLL" is written to the four memory cells at step S7. Then, at step S8, data is read out from the memory cells.

At step S9, the read data signal D is compared with the externally applied reference signal of "HLLL". In this case, since reference signals at an L level are respectively applied to the second to the fourth blocks, the comparison operation is not carried out in these blocks. Since a reference signal at an H level is applied to the first block, the comparison operation is carried out in the first block.

Although a result signal at an L level is always provided from the second and the third blocks, the result signal X' at an L level is provided only when the read data signal D does not match the reference signal RF1 at an H level in the first block B1.

If the read data signal D is at an H level although data at an L level is written to memory cell 4 of the first bit in the first block B1, the signals match each other. Therefore, since the result signals X' provided from these four blocks are all at an L level, the determination signal Y at an H level indicating a match is provided. As a result, it is determined that memory cell 4 of the first bit in the first block B1 is defective.

If the read data signal D does not match the reference signal of "HLLL", the read data signal D is compared with the reference signal of "LHLL" at step S10. If the read data signal D matches the reference signal of "LHLL", it is determined that a memory cell of the second bit is defective.

If the read data signal D does not match the reference signal of "LHLL", the read data signal D is compared with the reference signal of "LLHL" at step S11. If the read data signal D matches the reference signal of "LLHL", it is determined that a memory cell of the third bit is defective.

If the read data signal D does not match the reference signal of "LLHL", the read data signal D is compared with the reference signal of "LLLH" at step S12. If the read data signal D matches the reference signal of "LLLH", it is determined that a memory cell of the fourth bit is defective. If the signals do not match each other, it is determined that there is no defective memory cell in the four memory cells.

Therefore, a defective memory cell can be located by eight comparisons. If the determination signals Y all indicate a match when data of "HHHH" is written in memory cells and the determination signals Y all indicate a mismatch when data of "LLLL" is written to memory cells as a result of the eight comparisons, it is determined that there is no defective memory cell in these four memory cells.

In brief, data of "HHHH" is written to memory cells, and data signals read out from the memory cells are compared with reference signals. When the determination signal Y indicates a mismatch as a result of the comparisons, it is determined that a memory cell in the block supplied with a reference signal at an H level is defective.

On the other hand, data of "LLLL" is written to memory cells, and data signals read out from the memory cells are compared with reference signals. When the determination signal Y indicates a match as a result of the comparisons, it is determined that a memory cell in the block supplied with a reference signal at an H level is defective.

According to Embodiment 1, since the result signals are forced to always indicate a match in the blocks supplied with reference signals at an L level, and the comparison operation is carried out only in the block supplied with a reference signal at an H level, data signals read out from the memory cells can be compared with the externally applied reference signals bit by bit. Therefore, it is possible to easily locate a defective memory cell without unnecessary comparison operation. In addition, such an effect can be implemented by addition of three logic gates per one block.

Although the test mode signal TM is externally applied in Embodiment 1, a predetermined value may be externally written to an internal register (not shown) in the SRAM to generate the test mode signal TM in response to the written value.

In Embodiment 1, exclusive OR gate 6 corresponds to a comparing circuit which compares the data signal D read out from the corresponding memory cell 4 with the reference signal RF1 when the reference signal RF1 is at an H level. Inverter 11, NAND gate 12 and AND gate 13 correspond to a control circuit which carries out control so that the result signal X from exclusive OR gate 6 indicates a match irrespectively of whether the data signal D matching the reference signal RF1 when the reference signal RF1 is at an L level. n transistors 7, match line 8 and transistor 9 correspond to a determination signal generating circuit which generates the determination signal Y indicating a match when all of the result signals X' indicate a match, and which generates the determination signal Y indicating a mismatch when any of the result signals X' indicates a mismatch.

EMBODIMENT 2

Figure 7:
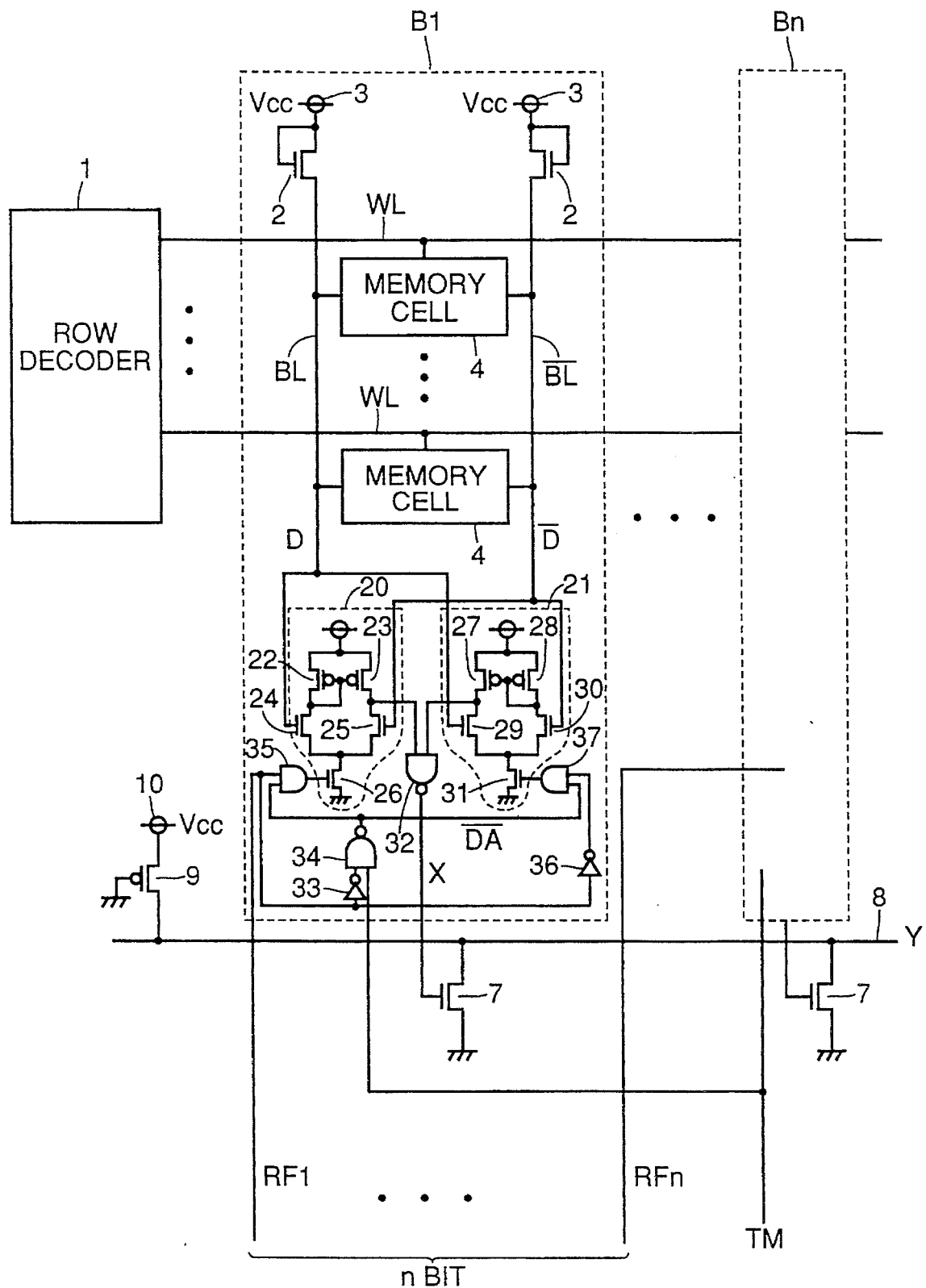
FIG. 7 is a block diagram showing a configuration of a semiconductor memory device according to Embodiment 2 of the present invention.

FIG. 7 is a block diagram showing a configuration of a SRAM according to Embodiment 2 of the present invention. The same or corresponding components as or to those of Embodiment 1 are labeled with the same reference characters, and the detailed description thereof will not be repeated. Detailed description will be given only of portions which are different from those of Embodiment 1.

Referring to FIG. 7, the SRAM includes two sense amplifiers 20 and 21 corresponding to each bit line pair BL, $\overline{BL}$.

One sense amplifier 20 includes P channel MOS transistors 22 and 23 configuring a current mirror circuit, an N channel MOS transistor 24 having a gate electrode connected to the bit line BL, an N channel MOS transistor 25 having a gate electrode connected to the bit line $\overline{BL}$, and an N channel MOS transistor connected between the source electrodes of transistors 24, 25 and the ground node.

The other sense amplifier 21 includes P channel MOS transistors 27 and 28 configuring a current mirror circuit, an N channel MOS transistor 29 having a gate electrode connected to the bit line BL, an N channel MOS transistor 30 having a gate electrode connected to the bit line $\overline{BL}$, and an N channel MOS transistor 31 connected between the source electrode of transistors 29, 30 and the ground node.

Sense amplifier 20 generates an output signal in response to the data signals D and $\overline{D}$ read out to the bit line pair BL, $\overline{BL}$, to apply the output signal to an NAND gate 32. Sense amplifier 21 generates an output signal complementary to the output signal from sense amplifier 20 in response to the data signals D and $\overline{D}$. Sense amplifier 21 supplies the complementary output signal to NAND gate 32.

NAND gate 32 generates the result signal X in response to the output signals. NAND gate 32 supplies the result signals to the gate electrode of corresponding discharge transistor 7.

The SRAM further includes an inverter 33 receiving the reference signal RF1, an NAND gate 34 receiving an output signal from inverter 33 and the test mode signal TM, an AND gate 35 receiving an output signal (deactivation signal) $\overline{DA}$ of NAND gate 34 and the reference signal RF1, an inverter 36 receiving the reference signal RF1, and an AND gate 37 receiving an output signal of inverter 36 and an output signal $\overline{DA}$ of NAND gate 34.

An output signal of AND gate 35 is applied to the gate electrode of N channel MOS transistor 26 in sense amplifier 20. Therefore, sense amplifier 20 is activated when the output signal of AND gate 35 is at an H level.

An output signal of AND gate 37 is applied to the gate electrode of N channel MOS transistor 31 in sense amplifier 21. Therefore, sense amplifier 21 is activated when the output signal of AND gate 37 is at an H level.

In FIG. 7, one bit line pair BL, $\overline{BL}$, two load transistors 2 connected to the bit line pair BL, $\overline{BL}$, a plurality of memory cells 4 connected to the bit line pair BL, $\overline{BL}$, two sense amplifiers 20, 21 connected to the bit line pair BL, $\overline{BL}$, NAND gates 32 and 34, AND gates 35 and 37, and inverters 33 and 36 configure one block B1. n such blocks B1 to Bn are disposed in the row direction in the SRAM. n blocks B1 to Bn are respectively supplied with the n-bit reference signals RF1 to RFn. n blocks B1 to Bn are also supplied with one test mode signal TM.

Operation of an SRAM of the above configuration will now be described.

When the test mode signal TM is set to an L level, normal comparison operation is carried out as follows. Description will be given here of the case where a data signal D at an H level is read out to the bit line BL, and a data signal $\overline{D}$ at an L level is read out to the bit line $\overline{BL}$.

Since NAND gate 34 receives the test mode signal TM at an L level, NAND gate 34 always supplies a deactivation signal $\overline{DA}$ at an H level to AND gates 35 and 37 irrespectively of the level of the reference signal RF1, which it receives through inverter 33. Therefore, the output signal of AND gate 35 is determined by the reference signal RF1 supplied thereto. The output signal of AND gate 37 is determined by the reference signal RF1 supplied thereto through inverter 36.

When the reference signal RF1 at an H level is supplied, AND gate 35 supplies the output signal at an H level to the gate electrode of transistor 26 in sense amplifier 20, thereby activating sense amplifier 20. Therefore, sense amplifier 20 amplifies the data signal D read out to the bit line BL, and supplies the output signal at an H level to NAND gate 32.

On the other hand, since AND gate 37 is supplied with an inverted signal of the reference signal RF1, AND gate 37 supplies the output signal at an L level to the gate electrode of transistor 31 in sense amplifier 21. Therefore, sense amplifier 21 is deactivated. Since sense amplifier 21 is not activated, sense amplifier 21 always supplies to NAND gate 32 the output signal at H level irrespectively of the data signals D, $\overline{D}$.

Since NAND gate 32 receives output signals both at an H level, NAND gate 32 generates the result signal X at an L level indicating a match. NAND gate 32 supplies the result signal X to the gate electrode of corresponding discharge transistor 7.

When the reference signal RF1 at an L level is supplied, AND gate 35 supplies the output signal at an L level to the gate electrode of transistor 26 in sense amplifier 20. As a result, sense amplifier 20 is deactivated, and the output signal at an H level is always supplied to NAND gate 32.

On the other hand, since AND gate 37 supplies the output signal at an H level to the gate electrode of transistor 31 in sense amplifier 21, sense amplifier 21 is activated. Sense amplifier 21 amplifies the data signal $\overline{D}$ read out to the bit line $\overline{BL}$, and supplies the output signal at an L level to NAND gate 32. Therefore, NAND gate 32 generates the result signal X at an H level indicating a mismatch to supply the same to the gate electrode of corresponding discharge transistor 7.

As described above, when the test mode signal TM is set to an L level, the data signals D, $\overline{D}$ read out from memory cells in each block are compared with the corresponding reference signals, similar to the conventional case. As a result, when the result signal X at an H level indicating a match is provided from at least one of n blocks B1 to Bn, the determination signal Y at an L level is provided.

On the other hand, when the test mode signal TM is set to an H level, the deactivation signal, $\overline{DA}$ supplied from NAND gate 34 is determined by the externally applied reference signals. Description will be given hereinafter of the cases where the reference signal at an L level and the reference signal at an H level are supplied respectively, provided that the data signal D at an H level is read out to the bit line BL, and that the data signal $\overline{D}$ at an L level is read out to the bit line $\overline{BL}$.

When the reference signal RF1 at an L level is supplied in the block B1, for example, the reference signal RF1 is applied to NAND gate 34 through inverter 33. NAND gate 34 generates the deactivation signal $\overline{DA}$ at an L level to supply the same to AND gates 35 and 37. Therefore, the output signals of NAND gates 35 and 37 both attain an L level, thereby deactivating both sense amplifiers 20 and 21. Since sense amplifiers 20 and 21 supply the output signals both at an H level to NAND gate 32, NAND gate 32 supplies the result signal X at an L level indicating a match to the gate electrode of corresponding discharge transistor 7. As described above, in a block supplied with a reference signal at an L level, the result signal X is provided which always indicates a match irrespectively of data signals read out from memory cells. More specifically, in the block supplied with a reference signal at an L level, the comparison operation is masked.

On the other hand, when the reference signal RF1 at an H level is supplied, NAND gate 34 supplies the deactivation signal $\overline{DA}$ at an H level to AND gates 35 and 37. Therefore, AND gate 35 supplies the output signal at an H level to the gate electrode of transistor 26 in sense amplifier 20. As a result, sense amplifier 20 is activated, and amplifies the data signal D to supply the output signal at an H level to NAND gate 32. Since AND gate 37 is supplied with the reference signal RF1 at an H level through inverter 36, AND gate 37 supplies the output signal at an L level to the gate electrode of transistor 31 in sense amplifier 21. As a result, sense amplifier 21 is deactivated, and supplies the output signal at an H level to NAND gate 32. Therefore, NAND gate 32 supplies the result signal X at an L level indicating a match to the gate electrode of corresponding discharge transistor 7. As described above, in a block supplied with a reference signal at an H level, the comparison operation is carried out. In this case, the result signal X at an L level indicating a match is provided.

When the data signal D at an L level is read out to the bit line BL, the data signal $\overline{D}$ at an H level is read out to the bit line $\overline{BL}$, and the reference signal RF1 at an H level is supplied, activated sense amplifier 20 amplifies the data signal D, and supplies the output signal at an L level to NAND gate 32. Deactivated sense amplifier 21 supplies the output signal at an H level to NAND gate 32 similar to the above. Therefore, NAND gate 32 supplies the result signal X at an H level indicating a mismatch to the gate electrode of corresponding discharge transistor 7. As a result, charge of match line 8 is discharged through transistor 7, whereby the potential of match line 8 falls to an L level. Therefore, an inverted signal Y at an L level is provided.

As described above, in a block supplied with a reference signal at an H level, normal comparison operation is carried out. Therefore, it can be determined whether the memory cell in one block is defective or not.

Since a method of identifying the defective memory cell using the SRAM is similar to that of Embodiment 1, the detailed description will not be repeated.

According to Embodiment 2, since the comparison operation is carried out block by block, it is possible to locate a defective memory cell without unnecessary comparison operation. Therefore, it is possible to identify a defective memory cell easily at a high speed. In addition, these effects can be implemented by adding simple circuits to the conventional device shown in FIG. 8.

In Embodiment 2, sense amplifiers 20 and 21, and NAND gate 32 correspond to a comparing circuit which compares the data signal D with the reference signal RF1 when the reference signal RF1 is at an H level. Inverters 33 and 36, NAND gate 34, and AND gates 35 and 37 correspond to a control circuit which carries out control so that the result signal X from the comparing circuit indicates a match irrespectively of the data signal D matching the reference signal RF1 or not when the reference signal RF1 is at an L level.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a plurality of memory cells each for storing one-bit data therein;

reading/writing means for reading data from said plurality of memory cells and writing data to said plurality of memory cells;

a plurality of comparing means provided corresponding to said plurality of memory cells for comparing a plurality of data signals corresponding to data read out from said plurality of memory cells by said reading/writing means with a plurality of reference signals externally applied corresponding to the plurality of data signals, correspondingly, wherein each of said comparing means generates a result signal indicating whether or not each data signal matches a corresponding reference signal when the corresponding reference signal is at a first logic level, and generates a result signal indicating a match irrespectively of whether or not each data signal matching the corresponding reference signal when the corresponding reference signal is at a second logic level; and determination signal generating means for generating a determination signal indicating a match when all of result signals from said plurality of comparing means indicate a match and for generating a determination signal indicating a mismatch when any of the result signals from said plurality of comparing means indicates a mismatch.

2. A semiconductor memory device, comprising:

a plurality of memory cells each for storing one-bit data therein;

reading/writing means for reading out data from said plurality of memory cells and writing data to said plurality of memory cells;

a plurality of comparing means provided corresponding to said plurality of memory cells and each comparing a data signal corresponding to data read out by said reading/writing means from the corresponding memory cell with a reference signal externally applied corresponding to the data signal, and generating a result signal indicating whether or not the data signal matches the reference signal when the reference signal is at a first logic level;

a plurality of control means provided corresponding to said plurality of comparing means and each controlling the corresponding comparing means so that a result signal from the corresponding comparing means indicates a match irrespectively of whether or not the corresponding data signal matching the corresponding reference signal when the corresponding reference signal is at a second logic level; and determination signal generating means for generating a determination signal indicating a match when all of result signals from said plurality of comparing means indicate a match, and for generating a determination signal indicating a mismatch when any of the result signals from said plurality of comparing means indicates a mismatch.

3. The semiconductor memory device as recited in claim 2, wherein said plurality of comparing means are activated in response to a predetermined activation signal.

4. The semiconductor memory device as recited in claim 2, wherein each of said plurality of control means includes a first logical product circuit responsive to the result signal from the corresponding comparing means and the corresponding reference signal for supplying a logical product signal thereof.

5. The semiconductor memory device as recited in claim 4, wherein each of said plurality of control means further includes a second logical product circuit responsive to the corresponding reference signal and a predetermined activation signal for supplying a logical product signal thereof to said first logical product circuit.

6. The semiconductor memory device as recited in claim 2, wherein each of said plurality of comparing means includes first amplifying means activated in response to the corresponding reference signal for amplifying, when activated, a first data signal corresponding to data read out from the corresponding memory cell, second amplifying means activated in response to the inverted signal of the corresponding reference signal for amplifying, when activated, a second data signal complementary to the first data signal, and means responsive to outputs from said first and second amplifying means for supplying the result signal to said determination signal generating means.

7. The semiconductor memory device as recited in claim 6, wherein each of said plurality of control means includes deactivating means for deactivating first and second amplifying means in the corresponding comparing means when the corresponding reference signal is at a second logic level.

8. The semiconductor memory device as recited in claim 7, wherein said deactivating means includes a third logical product circuit responsive to the corresponding reference signal and a reference signal synchronized with the reference signal for supplying logical product signal thereof to first amplifying means in the corresponding comparing means, and a fourth logical product circuit responsive to the inverted signal of the corresponding reference signal and the synchronized reference signal for supplying a logical product signal thereof to second amplifying means in the corresponding comparing means.

9. The semiconductor memory device as recited in claim 8, wherein said deactivating means further includes a fifth logical product circuit responsive to the corresponding reference signal and a predetermined activation signal for supplying a logical product signal thereof to said third and fourth logical product circuits.

10. A method of testing using a semiconductor memory device including a plurality of memory cells each for storing one-bit data therein, reading/writing means for reading out data from said plurality of memory cells and writing data to said plurality of memory cells, a plurality of comparing means provided corresponding to said plurality of memory cells and each comparing a data signal corresponding to data read out by said reading/writing means from the corresponding memory cell with a reference signal externally applied corresponding to the data signal, and generating a result signal indicating whether or not the data signal matches the reference signal when the corresponding reference signal is at a first logic level, a plurality of control means provided corresponding to said plurality of comparing means and each controlling the corresponding comparing means so that a result signal from the corresponding comparing means indicates a match irrespectively of whether or not the corresponding data signal matching the corresponding reference signal when the corresponding reference signal is at a second logic level, and determination signal generating means for generating a determination signal indicating a match when all of result signals from said plurality of comparing means indicate a match, and for generating a determination signal indicating a mismatch when any of the result signals from said plurality of comparing means indicates a mismatch, comprising the steps of:

writing data corresponding to the first logic level to said plurality of memory cells;

reading data from said plurality of memory cells;

supplying a plurality of reference signals including one reference signal of the first logic level and the other reference signals of a second logic level to said plurality of comparing means, correspondingly; and determining that one memory cell corresponding to the one reference signal of the first logic level is defective when the determination signal from said determination signal generating means indicates a mismatch.

* * * * *